United States Patent [19]

Izu et al.

[11] Patent Number: 5,411,591
[45] Date of Patent: May 2, 1995

[54] APPARATUS FOR THE SIMULTANEOUS MICROWAVE DEPOSITION OF THIN FILMS IN MULTIPLE DISCRETE ZONES

[75] Inventors: Masatsugu Izu, Bloomfield Hills; Buddie R. Dotter, II, Utica; Stanford R. Ovshinsky, Bloomfield Hills, all of Mich.; Wataru Hasegawa, Higashi-Osaka, Japan

[73] Assignee: Energy Conversion Devices, Inc., Troy, Mich.

[21] Appl. No.: 278,734

[22] Filed: Jul. 22, 1994

Related U.S. Application Data

[60] Division of Ser. No. 240,202, May 9, 1994, which is a continuation of Ser. No. 976,149, Nov. 13, 1992, abandoned.

[51] Int. Cl.$^6$ .................................. C23C 16/50
[52] U.S. Cl. ........................ 118/718; 118/723 MP; 118/723 MW; 118/723 ME; 118/723 AN; 118/724; 118/725; 118/730
[58] Field of Search .............. 118/718, 719, 723 MW, 118/723 ME, 723 MR, 723 MA, 723 MP, 723 AN, 724, 725, 729, 730; 156/345

[56] References Cited

U.S. PATENT DOCUMENTS 4,515,107 5/1985 Fournier et al. ........ 118/723 AN X
4,893,584 1/1990 Doehler et al. ................ 156/345 X
5,130,170 7/1992 Kanai et al. ........................ 427/38

FOREIGN PATENT DOCUMENTS

2-175878 7/1990 Japan.

Primary Examiner—R. Bruce Breneman
Assistant Examiner—Jonathan D. Baskin
Attorney, Agent, or Firm—David W. Schumaker; Marvin S. Siskind; Marc J. Luddy

[57] ABSTRACT

Apparatus for the simultaneous plasma assisted chemical vapor deposition of thin film material onto an elongated web of substrate material at a plurality of discrete spatially separated deposition zones. In order to accomplish said simultaneous deposition, the web of substrate material is operatively positioned so as to assume a serpentine path of travel through a reduced pressure enclosure. By using an elongated linear applicator as a source of microwave energy, a high rate of uniform deposition of said thin film material over a plurality of large areas of the web of substrate material can be simultaneously achieved without heating of said web above the melting point thereof. In a preferred embodiment, the web of substrate material is formed of a low temperature, microwave transmissive synthetic plastic resin and the thin film material deposited thereupon forms a barrier coating for preventing oxygen diffusion therethrough.

37 Claims, 5 Drawing Sheets

APPARATUS FOR THE SIMULTANEOUS MICROWAVE DEPOSITION OF THIN FILMS IN MULTIPLE DISCRETE ZONES

The subject patent application is a divisional patent application of U.S. patent application Ser. No. 08/240,202, filed May 9, 1994, which is a file wrapper continuation of U.S. patent application Ser. No. 07/976,149, filed Nov. 13, 1992, now abandoned.

FIELD OF THE INVENTION

This invention relates generally to apparatus for sustaining a substantially uniform microwave initiated plasma over a relatively large area and more particularly to novel apparatus for the simultaneous microwave initiated glow discharge chemical vapor deposition of uniform layers of thin film material over a plurality of large area zones on an elongated web of microwave transmissive substrate material. The microwave deposition assembly includes a linear, elongated applicator adapted to either radiate or transmit microwave energy via evanescent waves into the interior of an enclosure maintained at sub-atmospheric pressure. In the most preferred embodiment, the thin film material deposited upon the deposition surface of the web of substrate material is an ultra-thin, transparent barrier layer for inhibiting the diffusion of oxygen therethrough. Specific processing parameters are enumerated herein.

BACKGROUND OF THE INVENTION

One application of microwave energy is to efficiently create activated species from gaseous precursors for use in plasma treatment processes, such as semiconductor etching and thin film deposition. Previous microwave plasma deposition techniques, which illustrate the state of the art and highlight both the problems encountered in increasing the energy uniformity and the advantages provided by the microwave plasma generating structure and thin film deposition apparatus of the instant invention, will be discussed in the following paragraphs.

Commonly assigned, U.S. Pat. Nos. 4,517,223 and 4,504,518 to Ovshinsky, et al., both entitled "METHOD OF MAKING AMORPHOUS SEMICONDUCTOR ALLOYS AND DEVICES USING MICROWAVE ENERGY", the disclosures of which are incorporated herein by reference, describe processes for the deposition of thin films onto small area substrate in a low pressure, microwave glow discharge plasma. As specifically noted in these Ovshinsky, et. al, operation in the disclosed low pressure regimes not only eliminates powder and polymeric formations in the plasma, but also provides the most economic mode of plasma deposition. While these patents describe the revolutionary concept of operating at low pressure and high energy density utilizing microwave energy, i.e., operating at the substantial minimum of the modified Paschen curve, the problem of uniformity of the deposition of thin films over large areas remained addressed.

Turning now to microwave applicators for large area substrate, commonly assigned U.S. Pat. No. 4,729,341 of Fournier, et al., "METHOD AND APPARATUS FOR MAKING ELECTROPHOTOGRAPHIC DEVICES", the disclosure of which is incorporated by reference, describes a low pressure microwave initiated plasma process for depositing a photoconductive semiconductor thin film on a large area cylindrical substrate using a pair of radiative waveguide applicators in a high power process. However, the principles of large area deposition described therein are limited to cylindrically shaped substrates, such as electrophotographic photoreceptors, and the teachings provided therein are not directly transferable to elongated, generally planar substrates.

While workers in the field have disclosed methods of processing thin films utilizing the high power of microwave sustained plasmas, previously microwave plasma treatments have not been altogether appropriate for large surface area and/or low pressure deposition. This is because of the non-uniformity of the plasma over an enlarged or elongated substrate due to the non-uniformity of the energy initiating the plasma. One attempt to provide greater large area uniformity was the use of a slow wave microwave structure. A problem that is inherent in slow wave structures, however is the very rapid decline of microwave coupling into the plasma as a function of distance transverse to the microwave applicator. This problem has been addressed in the prior an by various structures that vary the spacing of the slow wave structure from the substrate to be processed. In this way the energy density at the surface of the substrate can be kept constant along the direction of movement of the substrate. For example, U.S. Pat. No. 3,814,983 to Weissfloch, et al. for "APPARATUS AND METHOD FOR PLASMA GENERATION AND MATERIAL TREATMENT WITH ELECTROMAGNETIC RADIATION and U.S. Pat. No. 4,521,717 to Kieser, et al., for "APPARATUS FOR PRODUCING A MICROWAVE PLASMA FOR THE TREATMENT OF SUBSTRATE IN PARTICULAR FOR THE PLASMA POLYMERIZATION OF MONITORS THEREON", both address this problem by proposing various spatial relationships between the microwave applicator and the substrate to be processed.

More, particularly, Weissfloch, et al. discloses that in order to obtain the uniform electric field intensity necessary for a plasma of uniform power density along the full length of the slow wave waveguide structure, it is necessary to incline the waveguide structure at an angle with respect to the substrate. It should be apparent, however, that inclination of the slow wave waveguide structure with respect to the substrate, to achieve uniformity, leads to an inefficient coupling of microwave energy into the plasma.

Recognizing this deficiency, Kieser, et al. described that the conditions resulting from superposing of two energy inputs, i.e., two microwave applicators, can be further improved if the two slow wave applicators are set at an angle to each other such that the planes normal to the medians of the applicators intersect at a straight line which extends parallel to the surfaces of the substrate to be treated and at fight angles to the direction of travel of the substrate. Moreover, Kieser, et al. recommended that in order to avoid destructive interference of the wave field patterns of the two applicators, the applicators should be displaced from each other transversely of the direction of travel of the substrate by a distance equal to half of the space between the crossbars of the waveguide. In this way the microwave field pattern is substantially suppressed.

The problem of plasma uniformity and more particularly, energy uniformity was treated by J. Asmussen and his co-workers, for example in T. Roppel, et al.

"LOW TEMPERATURE OXIDATION OF SILICON USING A MICROWAVE PLASMA DISC SOURCE", *J. Vac. Sci. Tech,* B-4 (January–February 1986) pp. 295-298 and M. Dahimene and J. Asmussen "THE PERFORMANCE OF MICROWAVE ION SOURCE IMMERSED IN A MULTICUSP STATIC MAGNETIC FIELD" *J. Vac. Sci. Tech.* B-4 (January–February 1986) pp. 126-130. In these, as well as other papers, Asmussen and his co-workers described a microwave reactor which they refer to as a microwave plasma disc source ("MPDS"). The plasma is reported to be in the shape of a disc or tablet, with a diameter that is a function of microwave frequency. A critical advantage claimed by Asmussen and his co-workers is that the plasma disc source is scalable with frequency: that is, at the normal microwave frequency of 2.45 gigahertz, the plasma disc diameter is 10 centimeters and the plasma disc thickness is 1.5 centimeters; but that the disc diameter can be increased by reducing the microwave frequency. In this way, the plasma geometry was said to be scalable to large diameters, potentially yielding a uniform plasma density over a large surface area. However, Asmussen, et al. only described a microwave plasma disc source which is operational at 2.45 gigahertz, where the plasma confined diameter is 10 centimeters and the plasma volume is 118 cubic centimeters. This remains far from being a large surface area. In order to provide for the deposition onto large area substrates, Asmussen, et at proposed a system operational at the lower frequency of 915 megahertz, which would provide a plasma diameter of approximately 40 centimeters with a plasma volume of 2000 cubic centimeters. Furthermore, the deposited material quality and deposition rate is dependent on excitation frequency. The modulation of frequency to increase plasma dimensions compromises material quality and film deposition rate.

Workers at Hitachi have described, for example in U.S. Pat. No. 4,481,229 to Suzuki., et al., the use of electron cyclotron resonance (ECR) to obtain a high power plasma having a relatively high degree of uniformity over a limited surface area. However, the Hitachi patent does not teach, nor even suggest a method by which uniform large area plasmas may be achieved. Moreover, the use of ECR imposes the added requirement of highly uniform magnetic field structures in the microwave apparatus, and may be restricted in operation to only those very low pressure regimes where electron collision times are long enough to allow the ECR condition to be achieved.

U.S. Pat. Nos. 4,517,223 and 4,729,341 referred to above, describe the necessity of using very low pressures in very high microwave power density plasmas in order to obtain high deposition rates and/or high gas utilization. However, the relationship between high deposition rates, high gas utilization, high power density, and low pressure further limits the utility of slow wave structures and electron-cyclotron resonance methods. The limitations of the slow wave structure and of the electron-cyclotron resonance methods were obviated by the method and apparatus disclosed in commonly assigned U.S. Pat. No. 4,893,584, to Doehler et al., "LARGE AREA MICROWAVE PLASMA APPARATUS", the disclosure of which is hereby incorporated by reference.

However, the apparatus of the '584 patent, as well as the apparatus of the prior art, each suffer from a specific inherent design problem. That is, the prior art apparatus, due to their specific configuration, allow coating of the microwave radiating applicator isolating means (i.e. microwave window, protective cylinder, etc.) by the deposition thereonto of material intended for the substrate web. In a continuous roll to roll process, this coating of the isolating means can cause reduced microwave efficiency at the intended deposition region, overheating of the isolating means and larger mounts of "downtime" due to the necessity of cleaning or replacing the isolating means.

It would be commercially advantageous to create a deposition apparatus in which material could be deposited onto a continuous web of substrate material at multiple sites upon the web during a single pass through the apparatus. This would allow for higher overall web speed, and in the case of temperatures sensitive substrate materials, would allow for multiple cooling stages between deposition sites to prevent overheating and possible destruction of the web of substrate material.

One particular application for the deposition of thin film coatings onto an elongated relatively wide web of substrate material is for the food packaging industry. More particularly, there has recently arisen a desire to deposit thin film oxygen and water vapor impermeable coatings atop an elongated polymeric web to be employed for packaging and giving extended shelf life to perishable foodstuffs. In order to accomplish this objective, researchers have previously developed thin film SiCO coatings and have even suggested the significance of controlling the hydrogen content of that thin film.

More particularly, the importance of controlling the hydrogen content of prior art films for the purpose of, inter alia, depositing oxygen impermeable films has been discussed in commonly assigned U.S. Pat. No. 4,737,379, the disclosure of which is incorporated hereinto by reference. As was noted therein, plasma deposited amorphous silicon hydrogen alloys, as well as alloys of silicon and hydrogen with one or more of carbon, oxygen and nitrogen suffered from various shortcomings. The hydrogen content was strongly dependent upon the substrate temperature, that content decreasing at high temperatures and increasing at low temperatures. The deleterious effect of hydrogenation on film properties, such as oxygen and water vapor permeability, is a direct consequence of hydrogen's role as a chemical bond terminator. As such, hydrogen can disrupt the connectivity of the chemical bond network of the deposited film, thereby reducing its average atomic coordination number. The solution preferred by said '379 patent was to eliminate the presence of hydrogen for the feedstock gases. This was at least partially due to the fact that thermally sensitive substrates, such as plastics, could not be heated sufficiently to eliminate hydrogen bonding in the deposited thin films. This inability to drive off hydrogen produced thin films characterized by greatly deteriorated properties which limited the utility of said films. However, the recipes set forth in the '379 patent fail to provide a film which exhibits the type of oxygen and water vapor permeation characteristics demanded by the food packaging industry.

Therefore, there is a need in the art for a continuous, roll to roll deposition apparatus which substantially eliminates coating of the microwave radiating applicator isolating means by deposition material and allows for multiple simultaneous depositions upon a low temperature web of substrate material in a single pass through the apparatus. There also exists a need for the deposition of thin film oxygen and water vapor impermeable flexible coatings atop a low temperature web of substrate material. These and other needs are met by the microwave apparatus and deposition method described hereinbelow.

BRIEF SUMMARY OF THE INVENTION

There is disclosed herein apparatus for the plasma enhanced chemical vapor deposition of thin film material onto an elongated web of substrate material utilizing a linear microwave applicator. More specifically, the apparatus includes a deposition chamber which is capable of being evacuated, means for evacuating the deposition chamber to sub atmospheric pressure, and an elongated web of substrate material disposed in the deposition chamber so that the deposition surface thereof substantially encloses a first interior volume of the chamber. The volume enclosed by the web of substrate material defines a first plasma region. The apparatus also includes means for introducing a precursor mixture of deposition gases into the first plasma region, a First linear, non-evanescent applicator for the substantially uniform introduction of microwave energy from a source into the first deposition region for disassociating the precursor gas mixture into a plasma of activated species and depositing the mixture of activated species onto the substrate. The linear applicator is operatively disposed adjacent to the non-deposition surface of the substrate. The precursor mixture of gases is substantially confined by the disposition of the web of substrate material relative to the linear applicator, whereby the associated precursor mixture is substantially prevented from depositing on the linear applicator.

The apparatus also includes means for isolating the microwave radiating applicator from the low pressure deposition region. The additional isolating means is formed from a material through which microwave energy can be radiated from the applicator means into the vessel and is configured into a shape substantially optimized to withstand the pressure differential to which it may be exposed. In this manner, the thickness of the isolating means may be minimized and a substantially uniform plasma operation may be performed along the surface of the elongated web of substrate material disposed in the deposition chamber. The isolating means is preferably cylindrically or hemi-cylindrically shaped so as to encapsulate at least that portion of the applicator means which extends into the vessel, though other generally smoothly curved surfaces may be employed with equal success. A vacuum seal is disposed between the cylindrically shaped isolating means and the vessel wall, so that a pressure differential may be maintained between the interior and the exterior of the cylindrically-shaped isolating means. Accordingly, pressure (vacuum) maintaining means is provided to maintain the pressure (vacuum) of said vessel disposed exteriorly of said cylindrically-shaped isolating means at a pressure approximating that required for plasma operation near the minimum of a modified Paschen curve. The thickness of the circumferential wall of the isolating means is designed to withstand that pressure differential which exists between the exterior and interior thereof.

The applicator preferably takes the form of an elongated waveguide which includes at least one aperture for substantially uniformly radiating microwave energy therefrom into the interior of the vacuum vessel. It is to be understood that the size of the apertures may be periodic or a periodic, and the size of the aperture may be equal to or less than one wavelength of the microwave energy. In other embodiments, a plurality of apertures are spacedly positioned along the longitudinal extent of the waveguide. Here, as above, the size and spacing of the apertures may be either periodic or a periodic.

An elongated substrate web is adapted to be continuously moved past the longitudinal extent of the waveguide. It is preferred that the substrate web is operatively disposed within a near field distance of said applicator. The applicator is adapted to substantially uniformly radiate microwave energy from the waveguide over a dimension greater than one wavelength of the microwaves and, preferably, greater than twelve inches. The applicator may further include shutter means adapted to ensure that a substantially uniform density of microwave energy is emitted from the aperture means along the entire longitudinal extent thereof.

The apparatus preferably further includes applicator cooling means. The cooling means may be a flux of air adapted to flow about the interior of the isolating means. In another preferred embodiment, the cooling means may include a concentric enclosure formed interiorly of and shaped similarly to said isolating means so as to define a conduit between said isolating means and said concentric enclosure. It is into this conduit that a coolant fluid, examples of which include water, oils or freon, is adapted to flow. The ability to utilize thin isolating means insures that said isolating means can be thermally cooled to a sufficiently low temperature that relatively high power microwave energy can be introduced into the vacuum vessel and excite a high electron density plasma without the heat which is associated therewith cracking said isolating means.

These and other objects and advantages of the instant invention will become apparent from the Detailed Description, the Drawings and the Claims which follow hereinafter.

DETAILED DESCRIPTION OF THE INVENTION

The instant invention relates to an apparatus for the simultaneous plasma enhanced chemical vapor deposition of thin film material onto multiple portions of an elongated web of substrate material utilizing a linear microwave applicator. Deposition occurs within an evacuated deposition chamber. By maintaining the vessel, at sub atmospheric pressures, it is possible to operate the plasma at a pressure approximately that required for operation near the minimum of the modified Paschen curve. Low pressure operation also allows for a longer mean free path of travel for the plasma excited species, thereby contributing to overall plasma uniformity. In this way, it is possible for the microwave deposition apparatus to sustain a uniform plasma reaction upon a substrate disposed within the near field distance of the microwave source.

Figure 1:
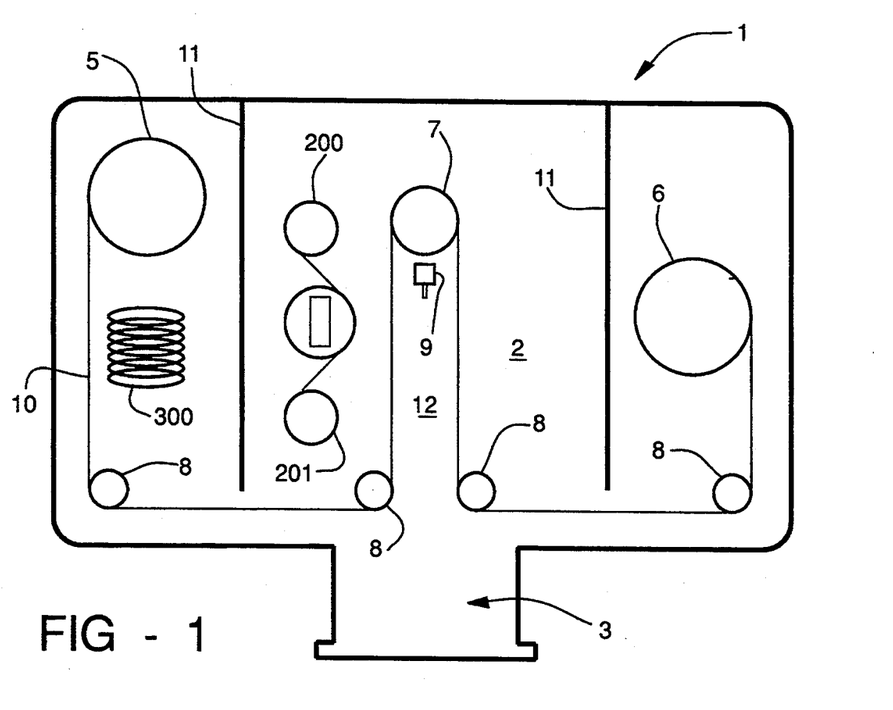
FIG. 1 is a schematic cross-sectional view of a first embodiment of the deposition apparatus of the instant invention, specifically illustrating the elements operatively disposed therein for effecting the uniform microwave plasma deposition on an elongated substrate; this figure illustrates an embodiment of the instant invention having a single plasma deposition region, employing a single gas manifold and a single elongated microwave applicator.

FIG. 1, illustrates, in schematic cross-section, a first embodiment of a microwave deposition apparatus 1 for sustaining a substantially uniform microwave plasma over a relatively wide web of substrate material. As used herein, the term "wide" refers to a body having a width dimension greater than one microwave wavelength, and preferably greater than twelve inches. The apparatus 1 includes, inter alia, a vacuum vessel deposition chamber 2, the walls of which are preferably formed of a durable, corrosion resistant material such as stainless steel. The vacuum vessel deposition chamber 2 further includes a pump-down port 3 adapted for suitable connection to a vacuum pump for maintaining the interior of the vacuum vessel deposition chamber 2 at an appropriate sub-atmospheric pressure. The vacuum pump is further adapted to remove reaction products from the interior of said vessel 2.

The vessel 2 further includes at least one process gas input line connected to a process gas input manifold 9, which manifold 9 is operatively disposed so as to uniformly distribute processed gases into the interior of said reaction vessel 2, and specifically into the plasma deposition region 12 thereof. The process gas input manifold 9 is operatively disposed between a pair of process gas containment means 11 and between at least two sections of the web of substrate material which define the deposition region 12. In combination, the web of substrate material and the process gas containment means 11 contain the process gas introduced by the manifold 9 into the plasma region 12 of the vacuum vessel deposition chamber 2.

During operation, the web of substrate material is drawn from payoff roll 5 and guided by guide rollers 8 toward the deposition region. Guide rollers 8 may be variable tension rollers to relieve stress upon the web of substrate material as it passes through the deposition chamber. After passing along one or more guide roller 8, the web of substrate material is passed between the linear microwave applicator 4 and the process gas injection manifold 9. The web of substrate material is then passed around chill roller 7, again passing gas port 9, around additional guide rollers 8, and collected upon take-up roll 6. The sections of the web of substrate material extending between guide roller 8 and chill roller 7 create an enclosed plasma deposition region 12. The precursor gas mixture injected from gas manifold 9 interacts with the microwave energy supplied by the elongated microwave applicator 4 to create energized species in deposition region 12. Deposition therefore occurs on both the section of substrate material leading toward and moving away from chill roller 7. Because plasma deposition is inherently a high temperature process, temperature sensitive substrates must be intermittently cooled so that destruction thereof is avoided. This cooling is accomplished by chill roller 7. Cooling the web of substrate material allows for a longer overall exposure time to the plasma deposition. The apparatus of FIG. 1 allows for high deposition rates and good process gas utilization by allowing for deposition on at least two discrete portions of the web of substrate material on a single pass.

The microwave deposition apparatus 1 further includes a microwave applicator unit 4 which extends at least partially into the interior of said vacuum vessel deposition chamber 2. The microwave applicator unit 4 is adapted to radiate microwave energy from a source thereof, into the interior of said vacuum vessel deposition chamber 2 for initiating and maintaining a plasma of the process gases introduced into said vessel 2 through a process gas manifold 9. The specifics of the microwave applicator unit 4 including the microwave applicator and microwave applicator isolating means will be discussed in detail hereinbelow.

Figure 2:
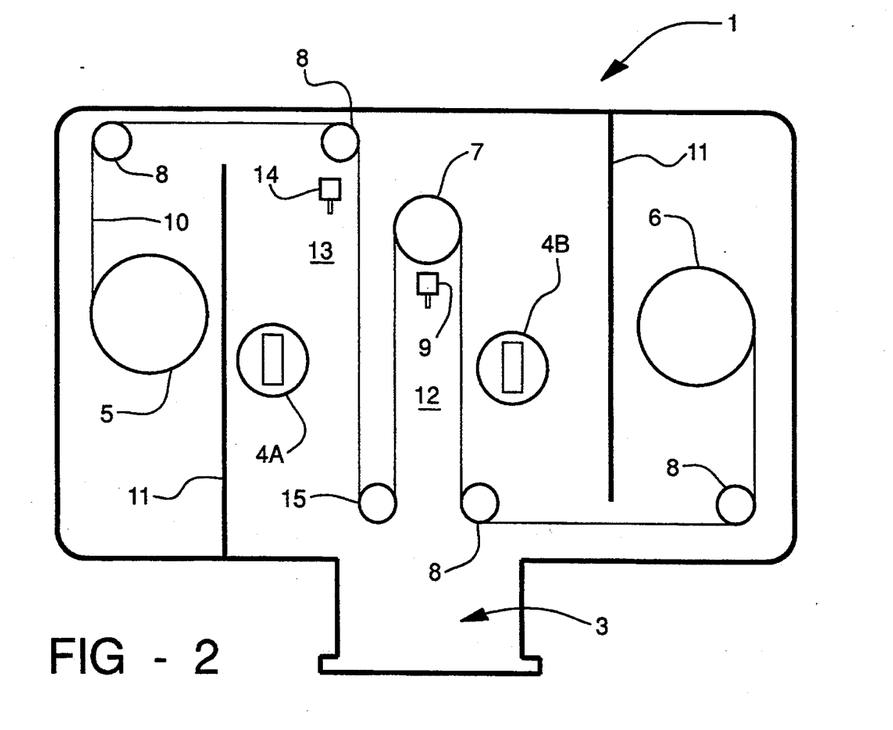
FIG. 2 is a schematic cross-sectional view of a second embodiment of the deposition apparatus of the instant invention, this embodiment employing a single deposition region, a single elongated microwave applicator, and two gas manifolds, the first of which is adapted to introduce the pre-cursor gaseous mixture and the second of which is adapted to introduce a non-depositing gas mixture to effectuate plasma pre-treatment of the deposition surface of the elongated web of substrate material.

Turning now to FIG. 2, there is shown a schematic cross-sectional view of a second embodiment of the microwave deposition apparatus of the instant invention. This second embodiment is similar to the microwave deposition apparatus of the first embodiment (FIG. 1) with the exception of the addition of a deposition surface pretreatment zone. The instant inventors have surprisingly found that microwave pretreatment of the deposition surface of the web of substrate material enhances the barrier properties of the deposited thin film. This microwave pre-treatment is preferably a plasma pre-treatment and most preferably an argon plasma pre-treatment. The argon plasma pre-treatment of the deposition surface of the web of substrate material occurs in a plasma pre-treatment zone 13. The argon is injected into the plasma pre-treatment zone 13 by pre-treatment gas manifold 14. The injected argon interacts with the microwaves from the linear microwave applicator 4 thereby pretreating the deposition surface of the web of substrate material. In order to pass the deposition surface of the web of substrate material past pre-treatment zone 13, the guide rollers 8 on the payoff roll 5 side of the deposition apparatus 1 must be moved to the opposite side of the microwave applicator visa vis the deposition apparatus of FIG. 1. In addition, another roller 15 must be added to the system. This additional roller 15 can be either a guide roller or a quench roller as required. It is hypothesized that this pretreatment process promotes the adherence of the coating to the web and possibly even affects the growth kinetics thereof.

Figure 3:
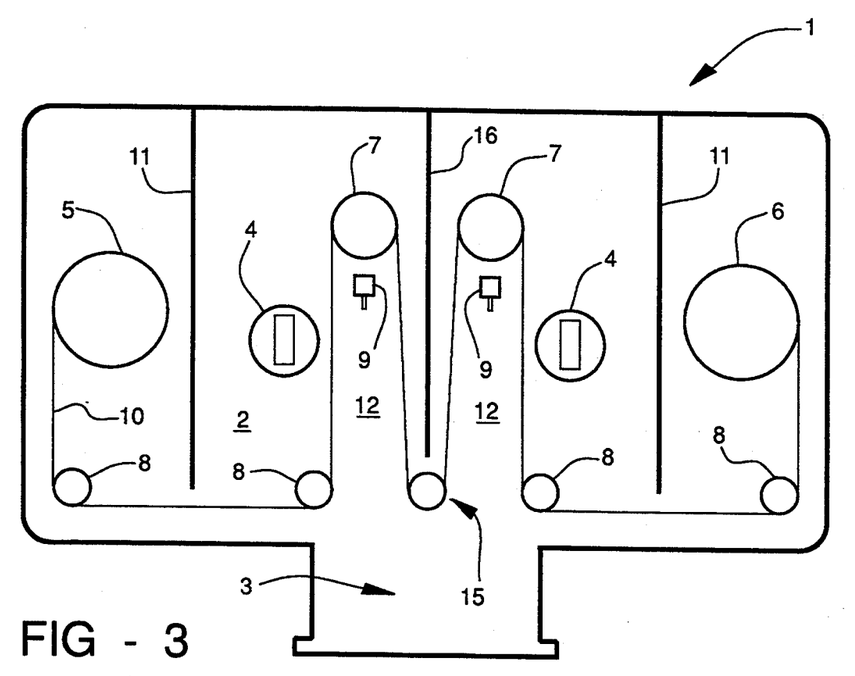
FIG. 3 is a schematic cross-sectional view of a third embodiment of the deposition apparatus of the instant invention, this apparatus employing two deposition regions, two elongated microwave applicators and two precursor gas mixture injection manifolds.

Turning now to FIG. 3, illustrated therein is a schematic cross-section of a third embodiment of the microwave deposition apparatus of the instant invention. This third embodiment is similar to the fast embodiment of FIG. 1 except for the inclusion of an additional deposition region 12 which includes an additional chill roller 7, an additional gas manifold 9, an additional guide roller 8, and an additional linear microwave applicator 4. Also, the embodiment of FIG. 3 includes a microwave barrier 16 which reduces or eliminates the interaction of microwaves from the linear applicators 4. This embodiment of the instant invention provides for very high deposition rates, due to the dual deposition regions 12 which allow deposition on at least four discreet portions of the web of substrate material during a single pass. This higher deposition rate allows for faster throughput of the web of substrate material, for a given deposited thin film thickness. This higher throughput speed reduces the temperature rig of the web of substrate material at any given deposition zone by reducing the time of exposure to the deposition plasma and allowing the web of substrate material to pass over cooling rollers between depositions.

Alternatively, the first deposition region of the microwave deposition apparatus of FIG. 3 may be used as a plasma pre-treatment region. In this instance, the deposition zone 12 which is closest to the pay off reel 5 would be used as a plasma pre-treatment zone 13, as in FIG. 2, by providing a non-depositing gas or gaseous mixture, such as argon, in the first gas manifold 9. This alternative embodiment would reduce any microwave losses encountered by the deposition apparatus of FIG. 2 due to the plasma pre-treatment microwave energy load by providing a separate linear microwave applicator for each of the plasma pre-treatment and plasma deposition zones.

Figure 4:
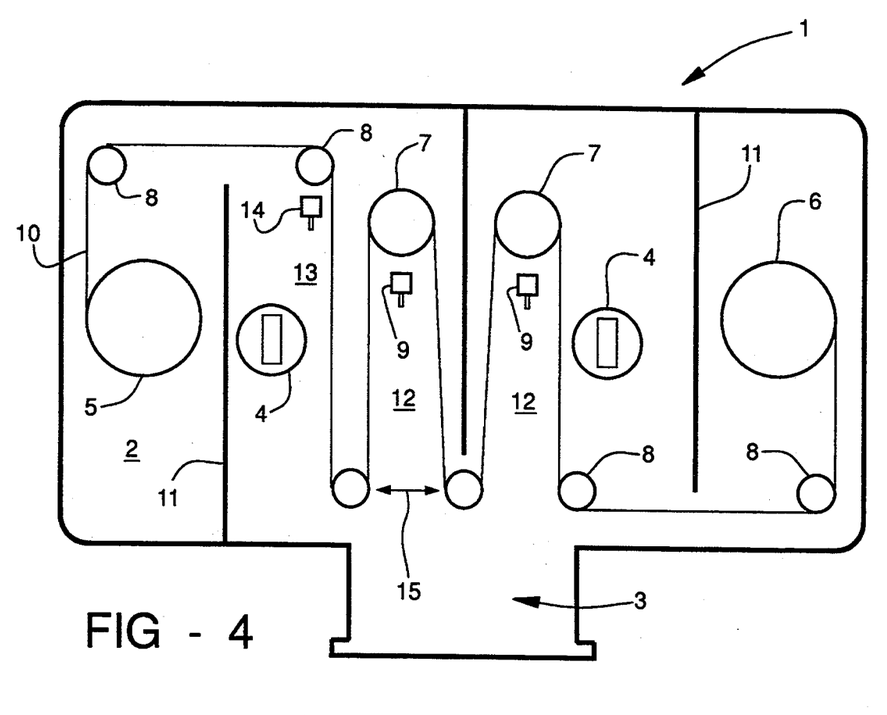
FIG. 4 is a schematic cross-sectional view of a fourth embodiment of the deposition apparatus of the present invention, this embodiment employing two elongated microwave applicators and three gas manifolds, two of which are adapted to introduce precursor gaseous mixture into the deposition regions and a third adapted to introduce a non-depositing gas mixture for the plasma pro-treatment of the deposition surface of the elongated web of substrate material.

Turning now to FIG. 4, there is depicted therein a cross-sectional schematic representation of a fourth embodiment of the microwave deposition apparatus of the instant invention. This embodiment combines both the dual deposition regions 12 of the embodiment of FIG. 3 and the plasma pretreatment region 13 of the embodiment of FIG. 2. Therefore, this embodiment allows for both high deposition ram/high throughput and plasma pre-treatment of the deposition surface of the web of substrate material for enhancement thereof.

Figure 5:
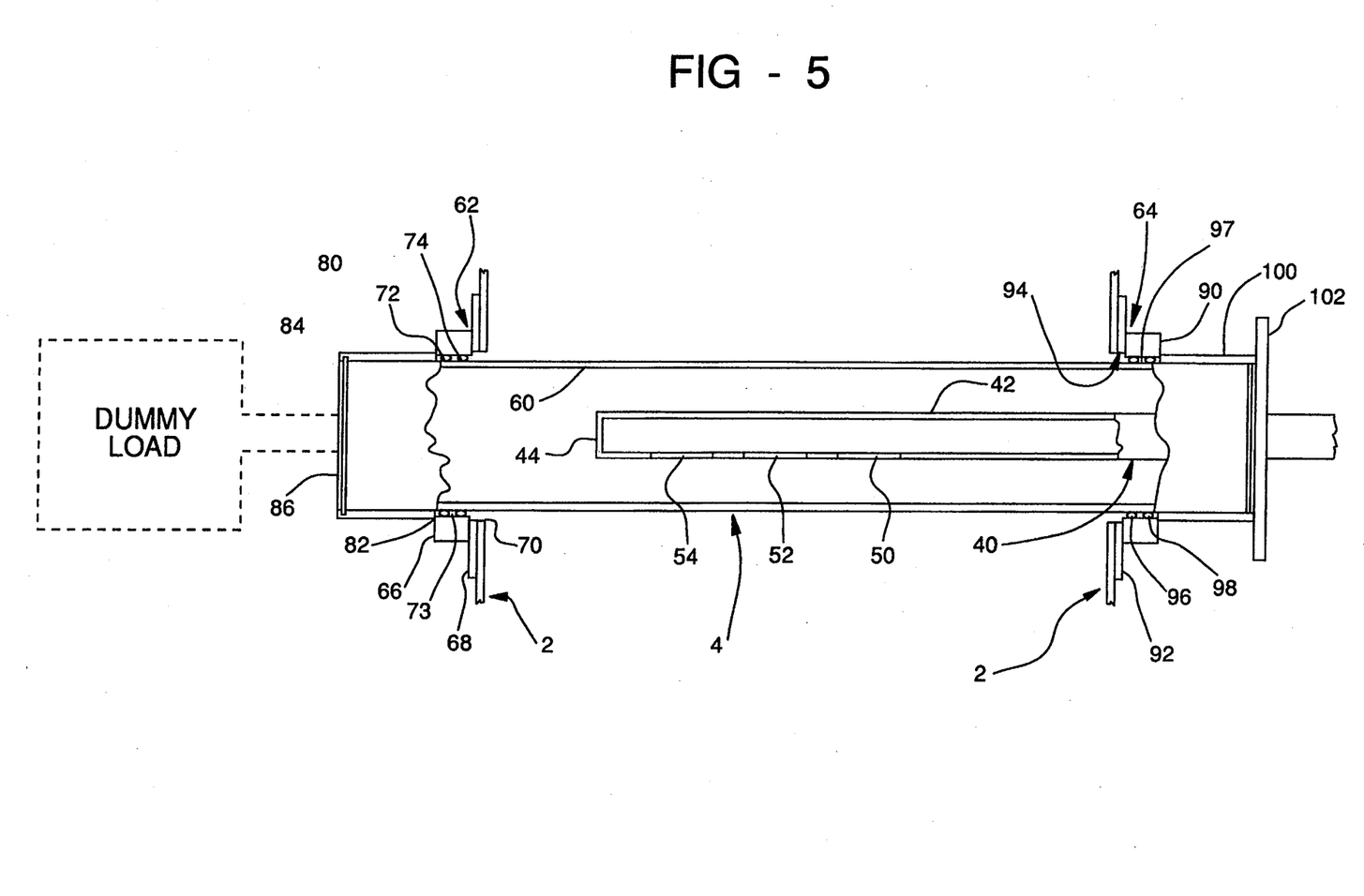
FIG. 5 is a cross-sectional view of a portion of the apparatus of the instant invention, specifically depicting a radiative linear microwave applicator unit operatively attached interiorly of the deposition chamber.

As is illustrated in FIG. 5, the microwave applicator unit 4 comprises a substantially rectangular waveguide 42 having an open end portion 44 at the terminal end portion thereof extended into the vessel 2. The open end portion is adapted to avoid standing waves. It is to be understood that the applicator unit 4 may alternatively be sealed at the terminal end thereof. The waveguide means 42 includes a plurality of apertures formed through a wider face thereof. The apertures are dimensioned and spaced to provide for the uniform radiation of microwave energy therefrom.

Figure 6:
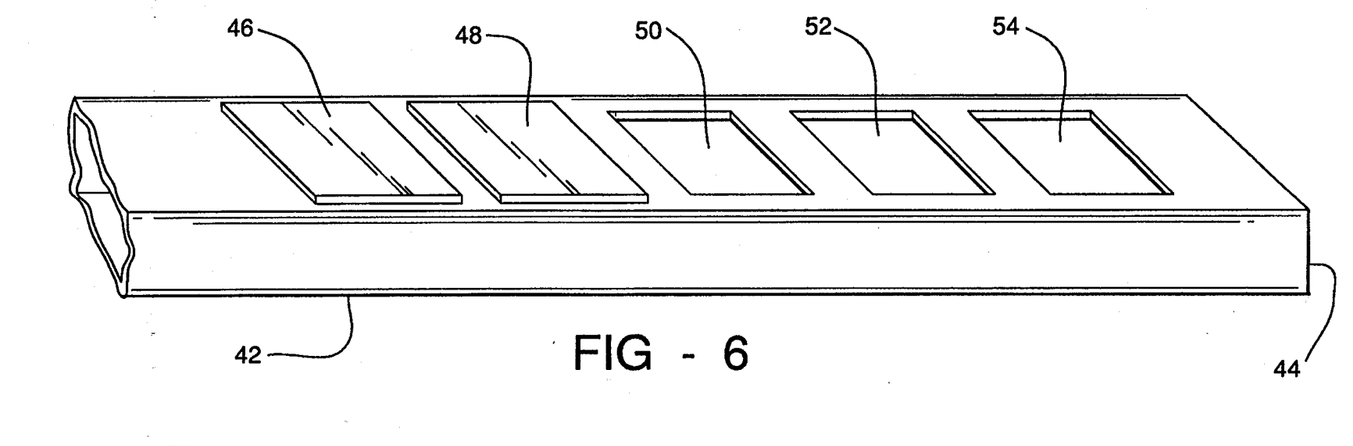
FIG. 6 is a fragmentary perspective view illustrating a first embodiment of the radiative microwave applicator of the instant invention with spacedly disposed discrete apertures formed through one of the wider faces thereof.
Figure 8:
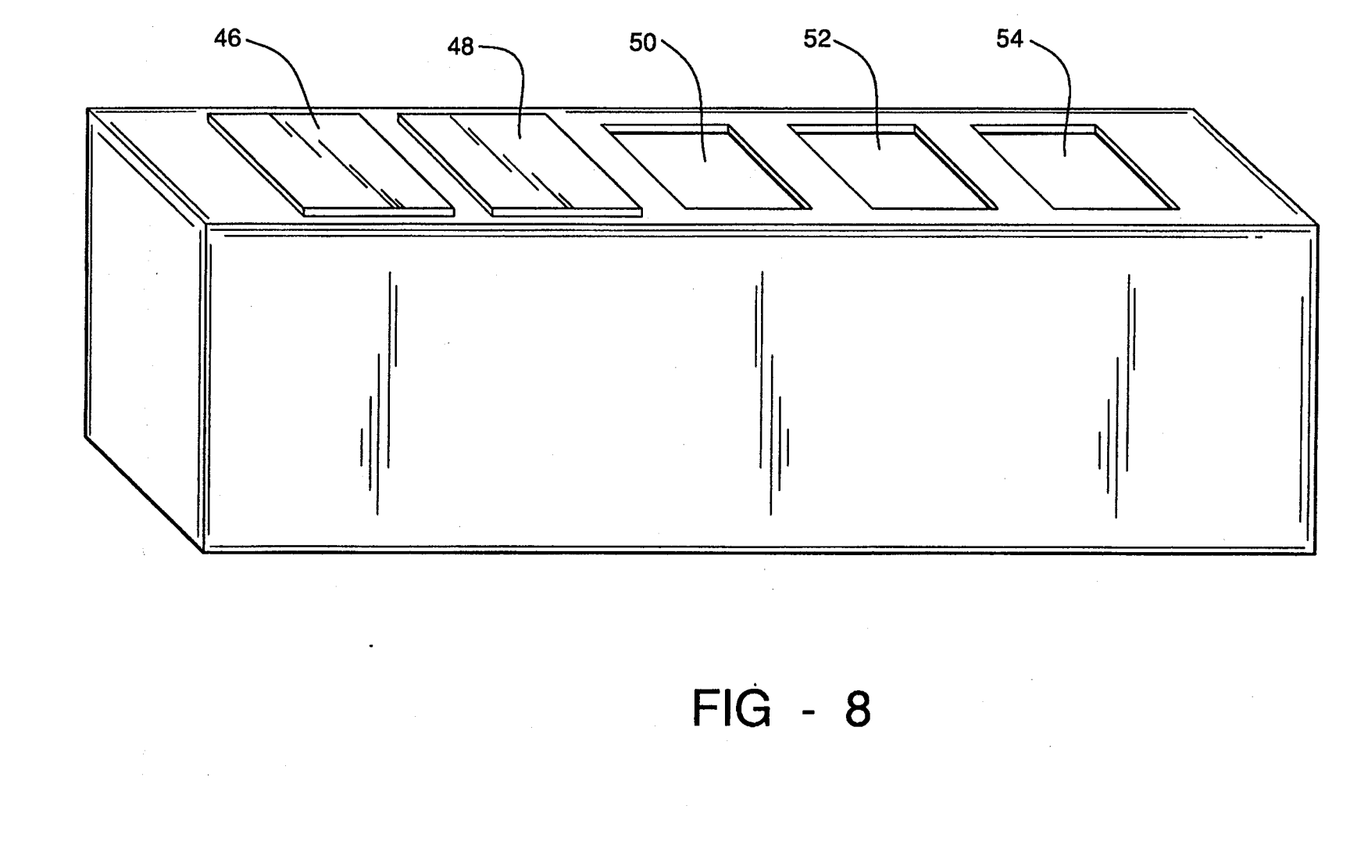
FIG. 8 is a fragmentary perspective view illustrating a second embodiment of the linear radiative microwave applicator of the instant invention in which the spacedly disposed apertures are formed along the longitudinal extent of one of the narrower faces thereof.

Illustrated in greater detail in FIG. 6, is a fragmentary perspective view of the microwave applicator unit rectangular waveguide 42 having the terminal end portion 44, and a plurality off spacedly disposed apertures, 46, 48, 50, 52 and 54 formed through a wider face thereof. As is illustrated therein, apertures 46 and 48 are blocked by microwave absorbing material to prevent microwave energy from radiating therefrom. It is to be understood that the density of the microwave energy radiated by the microwave applicator waveguide 42 can be distributed in a desired, controllable manner simply by blocking and partially unblocking various ones of the apertures. In FIG. 8, a second microwave applicator embodiment is depicted only differing from the FIG. 6 embodiment by the formation of said apertures through one of the narrower rectangular faces of the waveguide. Experiments have demonstrated that it is possible to maintain plasma uniformity over large area substrates, while increasing the mount of microwave energy introduced into the chamber by forming the apertures in the narrow waveguide face. This is believed to be due to the fact that current nodes are convergent along the narrower face as the microwaves travel through the rectangular waveguide structure.

The instant inventors have found that the size of the apertures is of great significance, in that the leak rate of microwaves through any one of said apertures is strongly dependent upon the size of that aperture. While the size of the aperture may be either larger or smaller than a wavelength of microwave energy, in the embodiment of FIG. 6, it is preferred that the aperture be the size of, or smaller than one wavelength of microwave energy. Additionally, the inventors have found that by partially unblocking the apertures, the apparatus 1 is capable of sustaining a plasma which is substantially uniform.

Figure 7:
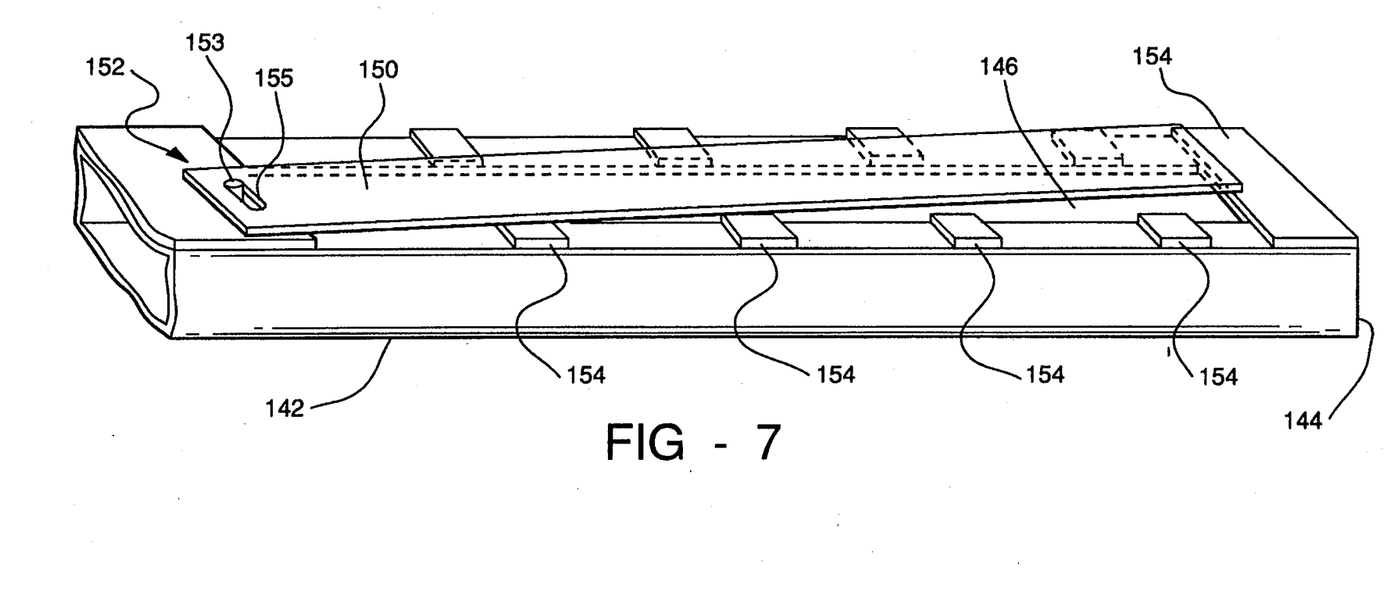
FIG. 7 is a fragmentary perspective view illustrating a second embodiment of the radiative microwave applicator of the instant invention with a single elongated aperture formed through one of the wider faces thereof and shutter means disposed thereover.

Referring now to FIG. 7, a third embodiment of the microwave applicator waveguide 142 has an open end portion 144 thereof and a single elongated, rectangular aperture 146, larger than a wavelength of microwave energy, formed through substantially the entire length and width dimension of a wider face thereof. The open end portion is adapted to avoid standing wave problems, though a sealed end portion may be employed for a given application. The waveguide 142 allows microwave energy to radiate from the entire aperture 146, though without more, the concentration of microwave energy is greatest at the end of the aperture nearest the source of microwave energy. The concentration of the microwave energy, and consequently the density of the plasma may be regulated by employing at least one elongated either straight or slightly curved metallic microwave shutter 150 operatively affixed to said microwave waveguide 142 by a single connection 152 consisting of, for example, a pin 153 through a channel 155, on the side of said waveguide nearest to the source of microwave energy. Disposed at the opposite end of said elongated aperture 146, and along the edges of said aperture, are dielectric insulator blocks 154 fabricated from, for example glass or teflon. The dielectric insulator blocks 154 are adapted to form an insulating barrier between the waveguide 142 and the microwave shutter 150. This is necessary since the microwave shutter 150 may be grounded to the waveguide means 142 only at the connection 152. Additional contact between the shutter 150 and the waveguide 142 will cause a so called "sizzling" ground, i.e., an arcing contact.

The waveguide embodiments shown and discussed in detail in connection with FIGS. 6 and 7 are of the type generally known as "leaky" microwave structures in that microwave energy is allowed to leak or radiate therefrom through a plurality of apertures. Alternatively, though not illustrated herein, the microwave applicators may be slow wave microwave structures. The slow wave structure delivers a significant pan of microwave energy by means of evanescent waves. This type of slow wave structure was discussed hereinabove with reference to the Weissfloch, et al. and Kieser, et al. patents. The microwave energy apparatus 1 of the instant invention substantially obviates the shortcomings inherent in slow wave structures, i.e., the rapid decline in applied energy coupled to the plasma as a function of distance along the direction transverse to the microwave structure. This shortcoming is substantially obviated herein by, inter alia, isolating the microwave applicator from the plasma region, thereby allowing the applicator to sustain a more uniform plasma.

Returning now to FIG. 5, the microwave applicator unit 4 further comprises means 60 for isolating the microwave waveguide 42 from the deposition chamber 2. The isolating means 60 is preferably fabricated from a dielectric material which is substantially transparent to microwave energy. A preferred material from which said isolating means 60 may be fabricated is quartz, though it is to be understood than many other materials may be employed with equal success. The isolating means 60 should further be configured in a shape designed to optimize its ability to withstand forces due to the presence of a pressure differential. In this manner, the thickness of the isolating means may be minimized to provide for effective thermal cooling whereby high microwave power densities may be employed without deleteriously effecting the isolating means. To this end, a preferred shape for said isolating means is cylindrical or hemi-cylindrical as to encapsulate at least that portion of the waveguide 42 which extends into the vacuum vessel 2.

A cylindrical or hemi-cylindrically shape is preferred to for example a planar shape, because a cylinder may be made thinner than a planar shape due to the strength inherent in a cylinder. Thus, a thin cylinder is capable of withstanding pressures which would require a much thicker planar plate. Additionally, a thick plate cannot be maintained at a uniform, relatively low temperature, as can a thin cylinder. Thus, a planar plate may be subject to thermal degradation, in a microwave plasma apparatus particularly at elevated power levels. By contrast, the thin cylindrical isolating means 60 may be uniformly cooled, and thus does not experience thermal degradation, and therefore does not impose practical limitations upon the mount of power which may be applied.

Additionally, the waveguide 42 should be operatively disposed within the isolation means 60 and spaced from the circumferential wall thereof. So disposed, the waveguide 42 may extend partially through the vacuum vessel 2, without being directly exposed of the plasma regions 12 or 13 contained therein.

The cylindrical isolating means 60 of FIG. 5 is configured so as to be coextensive with at least one dimension of the vacuum vessel 2, and protrude through at least a first and second wall portion of said vacuum vessel 2. The cylindrical isolating means 60 is fixed through the walls of the vacuum vessel 2 by means of two collar fittings 62 and 64 which are preferably mutably joined to the stainless steel vessel 2. Collar fitting 62 comprises an open end portion 66 extending from a connection flange 68 affixed directly to a side wall of the vacuum vessel 2, and includes an opening 70 co-extensive with the circumference of the cylindrical isolating means 60 and adapted to receive cylindrical isolating means 60. Open end portion 66 extends from said connection flange 68, and is adapted to receive at least two O-rings 72, 74, which O-rings 72, 74 are adapted to effect a vacuum and water barrier between the interior of said vacuum vessel 2 and outside ambient conditions. Between O-rings 72, 74 is disposed a cooling channel 73 through which a cooling medium such as water may be circulated to maintain the O-rings at a uniformly low temperature. The O-rings 72, 74 are preferably adapted to maintain the vacuum and water seal at substantially elevated temperatures, i.e., temperatures in excess of 100° Centigrade.

The cylindrical isolating means 60 passes through opening 70, connection flange 68, and the open end portion 66. In this way, O-rings 72, 74 are urged against the outside circumference of said cylindrical isolating means 60. The compression of the O-rings 72, 74 against the cylindrical isolating means 60 results in an air tight, water tight seal. It is important to note that the location of O-rings 72, 74 is well outside the plasma region 12 of the apparatus 1. This is noteworthy because by keeping the O-rings out of the plasma region 12, they are not exposed to the excessive temperatures associated with microwave plasmas, i.e., temperatures in excess of 500° Centigrade. Had the O-ring seals been located within the plasma region, as shown in the aforementioned U.S. Pat. No. 4,729,341, special (and costly) high temperature resistant seals would have been required, greatly increasing the complexity and cost of the apparatus 1.

The cylindrical isolating means 60 may extend beyond the outside terminal edge of said open end portion 66. This portion of the cylindrical isolating means 60 must thus be equipped with microwave containment means 80. The microwave containment means 80 is typically fabricated from a metal microwave containment canister operatively affixed around the outside circumference of the cylindrical isolating means 60, and in electrical contact with said open end portion 66 by grounding fingers 82. The microwave containment canister is fabricated so as to be coextensive with that portion of cylindrical isolating means 60 which extends beyond the open end portion 66. Additionally, the microwave containment means 80 further includes an open end portion 84 over which is disposed a metallic microwave blocking mesh 86 adapted to contain stray microwaves therewithin. The mesh 86 is also adapted to allow for the passage of a flux of cooling air through the cylindrical isolating means 60. Alternatively, and as is illustrated in phantom in FIG. 5, the opened end portion 84 of the microwave containment caster 80 may be attached to a dummy load adapted to absorb excess microwave radiation. This embodiment is particularly useful at high power levels, where excess reflected microwave energy causes reflection modes which may degrade the uniformity of the microwave plasma.

The vacuum vessel 2 is further adapted to receive the cylindrical isolating means 60 through at least a second wall portion thereof, preferably the wall portion opposite the wall portion upon which collar fitting 62 is mounted. Collar fitting 64 is disposed on said opposite wall position, substantially in line with collar fitting 62. Collar fitting 64 comprises an open end portion 90 extended from a connection flange 92. Connection flange 92 is affixed directly to the opposite wall position and includes an opening 94 co-extensive with the circumference of the cylindrical isolating means 60. The open end portion 90 extends from the connection flange 92, and is adapted to receive at least two O-rings 96, 98 which are adapted to effect a vacuum and water barrier between the vacuum vessel 2 and the surrounding ambient conditions. Between O-rings 96, 98 is disposed a cooling channel 97, through which a cooling medium such as water may be circulated so as to maintain the O-rings at a uniformly low temperature. The O-rings 96, 98 like O-rings 72, 74 are adapted to withstand elevated temperatures. The cylindrical isolating means 60 is passed through opening 94, through connection flange 92 and open end portion 90 whereby O-rings 96, 98 are urged against the outside circumferential edge of said cylindrical isolating means 60. The compression of said O-rings is the mechanism by which an air tight, water tight seal is effected. Also, O-rings 96, 98, like O-rings 72, 74, are well out of the plasma region 20, and therefore not subjected to degradation thereby.

By effecting an air-tight, water tight seal around the outer circumference of the cylindrical isolating means 60, it is possible to maintain the vacuum vessel 2 at substantially sub-atmospheric pressures, while the interior of the cylindrically isolating means 60 is maintained at atmospheric pressures, and is directly exposed to ambient conditions. This is in fact an advantage in the operation of the apparatus 1. By maintaining the vacuum vessel at sub-atmospheric pressures, it is possible to operate the apparatus 1 at a pressure approximating that required for operation near the minimum of a modified Paschen curve. Additionally, the low pressures allow for a longer mean free path of travel for the plasma species, thereby contributing to overall plasma uniformity. Since the interior of the cylindrical isolating means 60 is exposed to ambient conditions, a flux of cooling air may be maintained therethrough so as to prevent the excessive heating which may be associated with microwave plasmas. Alternatively, a microwave transmissive cooling medium such as silicon oil may be circulated within the cylinder to maintain a uniform, cool temperature. The cylindrical isolating means 60, extending beyond the open end portion 90 must be sheathed within a metallic microwave containment means 100, of the type described hereinabove. The microwave containment means 100 is disposed adjacent to connection plate 102 which affects a connection between the microwave waveguide 42, and a source of microwave energy.

Another form of substrate pretreatment, which may be used with or without plasma pretreatment, is a thermal bake-out of the substrate material. This bake-out may be accomplished by providing a heat generator (i.e. coil, lamp etc.) in the apparatus such that the substrate passes nearby before any plasma pretreatment or deposition occurs. See, for example, heater 300 in FIG. 1. This bake-out of the substrate is thought to drive off water from the bulk of the substrate, thereby reducing the water vapor transmission rate of the coated product.

Finally, although enclosure of the deposition plasma region 12 within the folds of the web of substrate material 10 is highly effective in preventing the deposition of coating material onto the quartz isolation tube, a web of microwave transmissive material on pay-out roller 200 (FIG. 1) may be operatively positioned interiorly of said deposition chamber 1 so as to slowly move about the surface of the isolation means of the linear microwave applicator 4 and be wound about the take-up roller 201. When the microwave transmissive web is coated with an excess thickness of depositing barrier material, the rollers are indexed and a clean portion of the web is allowed to collect the unwanted buildup. In this manner, even at extremely high rates of deposition, no coating is deposited onto the outer surface of the isolation means (the quartz tube). Accordingly, the deposition process can proceed for long periods of time and is specifically adapted for volume production.

EXAMPLE 1

A microwave deposition apparatus 1 as described hereinabove with reference to FIG. 1 was employed to fabricate a clear silicon based thin film oxygen permeation barrier layer coating upon an elongated web of polyester substrate material. The exact steps by which the above described apparatus 1 was used to fabricate such coatings will be detailed hereinbelow.

An elongated roll of 0.5 mil (12 micron) thick 30 cm wide polyester was used as the substrate for the instant example. The roll of polyester substrate was loaded onto the payout roller of apparatus 1 described hereinabove with reference to FIG. 1. After placing the substrate onto the payout roller 5, the apparatus 1 was closed and sealed so as to effect an air tight seal between the interior of the vessel and the surrounding ambient conditions. The interior of the vessel was then evacuated to a pressure of approximately 20 to 25 millitorr. Thereafter, the interior of said chamber was purged in an argon gas environment for a period of approximately one-half hour. After purging for approximately one-half hour, the chamber was evacuated to a background pressure of approximately 3 to 4 millitorr. Thereafter, preferred feedstock gases were introduced to the interior of said chamber through said input gas manifold 9 according to the following recipe:

| GAS | FLOW RATE |
| --- | --- |
| $SiH_4$ | 180 SCCM |
| $CO_2$ | 500 SCCM |
| $O_2$ | 500 SCCM |
| Ar | 400 SCCM |

A general range of gases for this four component mixture would be about 100 to 200 SCCM $SiH_4$, 300–700 SCCM $O_2$, 300–700 SCCM $CO_2$ and 300–700 SCCM Ar.

After initiating the flow of these feedstock gases into the interior of the vacuum vessel, a microwave plasma was initiated at a frequency of 2.45 GHz and at a power of approximately 5 kilowatts. The elongated web of substrate material was passed-through the deposition region 12 of the apparatus 1 at a rate of about 20 m/min. During the operation of the microwave plasma, a flux of cooling air was directed through the cylindrical isolating means 60 so as to maintain a uniform low temperature. Thereafter, microwave plasma was extinguished, and the flow of process gases to the vacuum vessel 2 was terminated.

After extinguishing the plasma and terminating the flow of process gases to the vacuum vessel 2, the interior of the reaction vessel was purged with argon, and the reaction vessel was vented to ambient conditions. Thereafter, the reaction vessel was opened and the substrate was removed for examination which revealed a uniform, clear, silicon based, thin film, oxygen permeation barrier coating on the web of substrate 10.

Tests indicate that the deposited film has the chemical composition $SiO_x$, where $x = 1.8-2$. Oxygen permeation tests on a coated substrate having a 200 Å thin film deposited thereon show an $O_2$ permeation of 1 cm$^3$/m$^2$/day at room temperature and 0% relative humidity.

In order to obtain the impressive oxygen and water vapor impermeability behavior described herein, it was necessary to devise a method of eliminating hydrogen from the deposited film taking into account the low melting point of the PET substrate. In this regard, both the effect of increased oxygen concentration in the precursor gaseous mixture was studied and the chemical bonds responsible for water vapor diffusion were studied by conducting IR spectroscopy on sample films deposited on crystalline silicon wafers. Table A summarizes the relationship of Si-H concentration versus water vapor transmission and the precursor mixture.

A perusal of Table A will demonstrate that the Si-H concentration and the water vapor transmission decreases with the increase of oxygen concentration in the precursor gaseous mixture. It is, of course, well established that Si-H bonds readily react with water. Accordingly, it is not surprising that Si-H bonds in the deposited films will absorb, react with and create a transmission pathway for the water vapor. The conclusion to be drawn is that the relatively poor water vapor permeation properties shown in samples 1 and 2 were due to the presence of Si-H bonds in the films and that increased oxygen concentration in the precursor mixture eliminated those Si-H bonds and increased the impermeability of the films. Note that the further increase of oxygen concentration in the precursor beyond that indicated in Sample 3, failed to improve the water barrier properties. Of course, the plasma treatment process detailed hereinabove further improved the barrier properties of the deposited film.

TABLE A

| SAMPLE No. | FEEDSTOCK GASES (SCCM) | | | | Si—H BOND CONTENT | H$_2$O VAPOR TRANS. RATE (gm/m$^2$-24 hrs.) 38° C., 100% RH |
|---|---|---|---|---|---|---|
| | SiH$_4$ | CO$_2$ | Ar | O$_2$ | | |
| 1 | 220 | 750 | 450 | 275 | 0.5% | 26 |
| 2 | 220 | 400 | 450 | 400 | Trace | 11 |
| 3 | 150 | 500 | 450 | 500 | None | 7 |

EXAMPLE 2

A microwave deposition apparatus 1 as described hereinabove with reference to FIG. 2 was employed to fabricate a second clear silicon based thin film oxygen permeation barrier layer coating upon an elongated web of polyester substrate material. A roll of 0.5 mil (12 micron) thick 30 cm wide polyester was again used as the substrate. The roll of polyester substrate was loaded onto the payout roller of apparatus 1 described hereinabove with reference to FIG. 2. After placing the substrate onto the payout roller 5, the apparatus 1 was closed and sealed so as to effect an air tight seal between the interior of the vessel and the surrounding ambient conditions. The interior of the vessel was then evacuated to a pressure of approximately 20 to 25 millitorr. Thereafter, the interior of said chamber was purged in an argon gas environment for a period of approximately one-half hour. After purging for approximately one-half hour, the chamber was evacuated to a background pressure of approximately 3 to 4 millitorr. Thereafter, feedstock gases were introduced to the interior of said chamber through said input gas manifold 9 according m the following recipe:

| GAS | FLOW RATE |
|---|---|
| SiH$_4$ | 300 SCCM |
| O$_2$ | 900 SCCM |
| He | 100 SCCM |

A general range for this three component mixture would be about 200–400 SCCM SiH$_4$, 800–1000 SCCM O$_2$, and 0–200 SCCM He.

Additionally, 400 SCCM of Ar was introduced to the plasma pretreatment zone 13 through gas manifold 14. After initiating the flow of these gases into the interior of the vacuum vessel, microwave plasmas were initiated at a frequency of 2.45 GHz and at a power of approximately 6 kilowatts for Ar plasma pretreatment and 5 kilowatts for plasma deposition. The elongated web of substrate material was passed through the plasma pretreatment region 13 and deposition region 12 of the apparatus 1 at a rate of about 20 m/min. During the operation of the microwave plasma, a flux of cooling air was directed through the cylindrical isolating means 60 so as to maintain a uniform low temperature. Thereafter, microwave plasma was extinguished, and the flow of process gases to the vacuum vessel 2 was terminated.

After extinguishing the plasma and terminating the flow of process gases to the vacuum vessel 2, the interior of the reaction vessel was purged with argon, and the reaction vessel was vented to ambient conditions. Thereafter, the reaction vessel was opened and the substrate was removed for examination which revealed a uniform, clear, silicon based, thin film, oxygen permeation barrier coating on the web of substrate 10.

Tests indicate that the deposited film has the chemical composition $SiO_x$, where $x = 1.8-2$. Permeation tests on a coated substrate having a 150 Å thin film deposited thereon show an $O_2$ transmission rate of less than 1 cm$^3$/m$^2$/day at room temperature and 0% relative humidity and a water vapor transmission rate of less than 1 g/m$^2$/day at 38° C. and 100% relative humidity.

While the specific examples of the method of depositing high barrier coatings by microwave plasma enhanced CVD recited herein above are described with reference to flat rolls of substrate material and the apparatus of the instant invention, it should be noted that the present method is useful for deposition of high barrier coating onto substrates of any shape, by any machine which is capable of deposition onto the desired substrate. Other types of substrates which would benefit from a coating of high barrier material would be those such as plastic bottles, jars or other plastic containers in which the material to be stored is sensitive to water or oxygen. Of specific interest is coating the interior of plastic bottles or jars for storage of food or beverages. As long as the basic microwave deposition steps are present (i.e. such as thermal bake-out, plasma pretreatment, microwave PECVD of high barrier coating etc.), the shape and/or size of the substrate and/or portion of the substrate to be coated is irrelevant.

While the invention has been described in connection with preferred embodiments and procedures, it is to be understood that it is not intended to limit the invention to the described embodiments and procedures. On the contrary it is intended to cover all alternatives, modifications and equivalence which may be included within the spirit and scope of the invention as defined by the claims appended hereinafter.

What is claimed is:

1. Apparatus for the plasma enhanced chemical vapor deposition of thin film material onto an elongated web of substrate material, said apparatus including in combination:

an evacuable deposition chamber;

means for evacuating said deposition chamber to sub-atmospheric pressure;

an elongated web of substrate material disposed in said deposition chamber so that the deposition surface thereof substantially encloses a first interior volume of said chamber, said first volume defining a first plasma region;

linear applicator means for introducing a precursor mixture of deposition gases into said first volume;

means for the substantially uniform introduction of microwave energy from a source into said first volume for disassociating the precursor gaseous mixture into a plasma of activated species and depositing the activated species onto said substrate web, said microwave introduction means, operatively disposed adjacent the non-deposition surface of said substrate web; and said precursor mixture substantially confined by the disposition of the web of substrate material relative to the microwave introduction means, whereby the activated species are substantially prevented from depositing on the linear applicator.

2. The apparatus of claim 1, wherein the microwave introduction means is a first linear non-evanescent applicator.

3. The apparatus of claim 2, wherein the linear applicator further includes means, for isolating said applicator from the pressure existing within said chamber; said isolating means (1) formed from a material through which microwave energy can radiate, and (2) configured in a shape substantially optimized to withstand pressure differentials.

4. The apparatus of claim 3, wherein said isolating means is configured in a substantially hemispherical shape.

5. The apparatus of claim 4, wherein said isolating means is formed as a portion of a cylindrically shaped quartz tube.

6. The apparatus of claim 5, wherein the thickness of said quartz tube is selected so as to withstand a pressure differential in which the applicator is maintained at atmospheric pressure and said deposition volume is maintained at a sub-atmospheric pressure of from 0.01 to 100 millitorr.

7. The apparatus of claim 3, further including means for introducing a non-depositing gas adjacent the first interior volume to inhibit the diffusion of activated species into the non-depositing volumes of the chamber and to limit deposition of said activated species onto said isolating means.

8. The apparatus of claim 2, wherein said web of substrate material is formed of synthetic plastic resin.

9. The apparatus of claim 8, wherein said synthetic plastic resin is a polyester.

10. The apparatus of claim 2, further including a pay-off reel about which the web of substrate material is wound prior to the deposition of said activated species thereupon; and a take-up reel about which the web of substrate material is rewound following said deposition.

11. The apparatus of claim 10, wherein the web of substrate material is operatively disposed so as to assume a serpentine path of travel through said chamber as it moves from the pay-off reel to the take-up reel; said serpentine path of travel adapted to expose any given portion of the deposition surface of the web of substrate material to the plasma region at a minimum of two discrete, spatially separated positions.

12. The apparatus of claim 11, wherein the serpentine path of travel of the web of substrate material through said chamber is such that the plasma of activated species deposits material upon the deposition surface thereof at a minimum of four discrete, spatially separated positions.

13. The apparatus of claim 12, further including a second linear, non-evanescent applicator operatively disposed in said chamber remote of said first applicator for the disassociating precursor gaseous mixtures in the discrete positions.

14. The apparatus of claim 12, further including a first turning roller operatively disposed along the serpentine path of travel of the web of substrate material between the first and second deposition positions, said web of substrate material passing over the first turning roller so as to change the direction of travel thereof.

15. The apparatus of claim 14, further including at least a second set of turning roller operatively disposed along the serpentine path of travel of the web of substrate material between the second and third of said deposition positions, said web of substrate material passing over the second turning roller so as to change the direction of travel thereof.

16. The apparatus of claim 15, further including a third turning roller operatively disposed along the serpentine path of travel of travel of the web of substrate material between the third and the fourth of said deposition positions, said web of substrate material passing over the third turning roller so as to change the direction of travel thereof.

17. The apparatus of claim 15, wherein at least said first and third turning rollers further include means for cooling the circumferential extent thereof so as to decrease the temperature of the web of substrate material which is placed in intimate contact therewith as said web passes thereover after moving through the discrete deposition positions.

18. The apparatus of claim 17, wherein said means for introducing a precursor gaseous mixture is a first gas manifold operatively disposed interiorly of the first volume in said first plasma region of said chamber.

19. The apparatus of claim 18, wherein said serpentine path of travel of the web of substrate material between the second set of turning rollers and the take-up roller substantially encloses a second interior volume of said chamber, said second volume defining a second plasma region; and said means for introducing a precursor gaseous mixture further includes a second gas manifold operatively disposed interiorly of the second volume in said second plasma region of said chamber.

20. The apparatus of claim 19, wherein said first and second gas manifolds are elongated and include along the longitudinal extent thereof a plurality of spacedly disposed openings for introducing said precursor gaseous mixture.

21. The apparatus of claim 20, wherein the length of each of said gas manifolds is substantially coextensive with the transverse width of the web of substrate material, whereby a uniform flow of said precursor gaseous mixture through said plurality of spaced openings is established along substantially the entire transverse width of said web.

22. An apparatus as in claim 21, further including a second linear, non-evanescent applicator for the substantially uniform introduction of microwave energy from a source into said second volume for disassociating the precursor gaseous mixture into a plasma of activated species and depositing the disassociated mixture of activated species onto the said substrate web.

23. The apparatus of claim 22, wherein said second linear applicator is operatively disposed adjacent the non-deposition surface of the web of substrate material between the fourth discrete deposition position and the take-up reel.

24. The apparatus of claim 23, wherein the second linear applicator further includes means, other than the web of substrate material, for isolating said applicator from the deposition regions; said isolating means (1) formed from a material through which microwave energy can be radiated, and (2) configured in a shape substantially optimized to withstand to withstand pressure differentials.

25. The apparatus of claim 24, wherein said isolating means is configured in a substantially hemispherical shape.

26. An apparatus as in claim 25, wherein said isolating means is formed as a portion of a cylindrically shaped quartz tube.

27. An apparatus as in claim 26, wherein the thickness of said quartz tube is selected so as to withstand a pressure differential in which the applicator is maintained at atmospheric pressure and said deposition volume is maintained at a sub-atmospheric pressure of from 0.01 to 100 millitorr.

28. An apparatus as in claim 27, further including means for introducing a non-depositing gas adjacent that volume of the chamber adjacent the second linear applicator to inhibit the diffusion of the deposition gaseous mixture into the non-depositing volume and limit deposition onto the surface of said applicator.

29. An apparatus as in claim 2, further including means for exposing the deposition surface of said web of substrate to a non-depositing microwave pretreatment to enhance to surface properties thereof.

30. The apparatus of claim 29, wherein said means for exposing the deposition surface of said web of substrate to a non-depositing microwave pretreatment include means for a plasma pretreatment.

31. The apparatus of claim 30, wherein said means for exposing the deposition surface of said web of substrate to a non-depositing microwave pretreatment include means for an argon plasma pretreatment.

32. The apparatus of claim 22, wherein said applicator includes a rectangular waveguide having spacedly disposed apertures formed along one of the faces thereof for the emission of microwaves therethrough.

33. The apparatus of claim 32, wherein the apertures are formed along one of the wide rectangular faces of said waveguide.

34. The apparatus of claim 33, wherein the apertures are formed along one of the narrow rectangular faces of said waveguide.

35. The apparatus of claim 22, further including means to thermally bake said web of substrate material prior to deposition of the activated species thereon.

36. The apparatus of claim 35, wherein said means to thermally bake said web of substrate material comprises a heater coil.

37. The apparatus of claim 35, wherein said means to thermally bake said web of substrate material comprises an infrared lamp.

* * * * *